United States Patent [19]

Schoon

[11] Patent Number: 4,631,726
[45] Date of Patent: Dec. 23, 1986

[54] LASER DIODE CONTROL CIRCUITRY

[75] Inventor: David J. Schoon, North Branch, Minn.

[73] Assignee: Minnesota Mining and Manufacturing Company, St. Paul, Minn.

[21] Appl. No.: 470,489

[22] Filed: Feb. 28, 1983

[51] Int. Cl.$^4$ ............................................. H01S 3/13
[52] U.S. Cl. ................................................... 372/31
[58] Field of Search ...................... 372/29, 31; 355/45

[56] References Cited

U.S. PATENT DOCUMENTS 4,504,976  3/1985  Beaudet .............................. 372/31

Primary Examiner—William L. Sikes
Assistant Examiner—Robert E. Wise
Attorney, Agent, or Firm—Donald M. Sell; James A. Smith; Robert L. Marben

[57] ABSTRACT

Circuitry for control of the level of light output from a laser diode that is adapted to direct its light output to a resonant scanning mirror including a biasing current circuit portion for providing a current level for the laser diode at a desired set point and a circuit portion connected to the laser diode which reduces the current through the laser diode by an amount that is inversely proportional to the velocity of the scanning mirror so the amount of light energy received from the scanning mirror at any portion of a scan surface covered by the scanning mirror will be the same when the laser diode is on. Another circuit portion is also connected directly to the laser diode to selectively reduce the current through the laser diode to a level that is below the laser diode threshold current in accordance with binary signals supplied to such circuit portion.

1 Claim, 6 Drawing Figures

LASER DIODE CONTROL CIRCUITRY

BACKGROUND OF THE INVENTION

This invention relates to circuitry for control of the level of light output from a laser diode where light from the laser diode is directed to a resonant scanning mirror.

The operating characteristics of a laser diode are such that short duration transient spikes in voltage or current should be avoided to prevent damage to the laser diode. Consideration must also be given the light output versus current relationship which is quite steep. In addition, the use of a laser diode that is directed to the surface of a receptor member via a resonant scanning mirror requires that the output from the laser diode be changed in proportion to the velocity of the mirror, which is sinusoidal in nature, in order that the light energy is evenly received at the receptor. In the case where the laser diode is used in a printer, the laser diode must be turned on and off in accordance with the image to be printed.

Known arrangements for providing circuitry for modulating the output of a laser diode are based on current levels provided to the laser diode that are all additive in the same direction, or require changing of the duty cycle of digital control pulses. Another approach involves the combining of signals prior to any application to the laser diode. Such prior arrangements are complex in nature and are also subject to high frequency transients which are undesirable from the standpoint of protecting the laser diode and from the standpoint of image quality when the laser diode is used in a printer using electrophotographic technology.

SUMMARY OF THE INVENTION

The shortcomings of the prior art for meeting desired requirements for a control circuit for a laser diode adapted to direct its output to a scanning mirror are overcome by the present invention which includes means for providing a bias current for the laser diode that is in excess of the laser threshold current plus a means that is operatively connected to respond to the velocity of the scanning mirror for providing a signal to the laser for changing the current through the laser diode, with such signal varying inversely with the velocity of the scanning mirror to cause the laser diode light output to vary directly with the velocity of the scanning mirror. The bias current means provides the bias current in response to the difference between a signal derived from the laser diode light output and a reference signal.

Another aspect of the present invention is the presentment directly to the laser diode of the scanning mirror velocity related signal for changing the current through the laser diode.

The present invention also includes means for receiving digital signals for providing a signal to the laser diode for one state of the digital signal which reduces the current through the laser diode below the laser threshold current. Such signal is also applied directly to the laser diode.

A further feature of the present invention includes a provision for a control input for timing, relative to the operation of the scanning mirror, of the operation of the means which provides the signal that varies inversely with the velocity of the scanning mirror as well as the means which receives the digital signals.

By having a signal that varies inversely with the velocity of the scanning mirror to cause the laser diode light output to vary directly with the velocity of the scanning mirror, the laser diode light energy that is provided to a receptor member, such as a photoconductive member, after reflection from the scanning mirror will be applied evenly at such receptor member. This is important if uniform imaging is to be obtained when the laser diode scanning combination is used in a printer using electrophotographic technology.

The aspect of having the bias current as a function of the difference between the laser diode light output and a reference signal provides a means for compensating the operation of the laser diode caused by changes in temperature of the laser diode.

By having the signals that influence the light output of the laser diode applied separately and directly to the laser diode, any influence that might be presented between the circuits providing such signals, if such independence were not maintained, is avoided. Since the various signal producing portions act independently of each other, cross-talk is avoided which, if present, could damage the laser diode or alter its operation in an undesirable way and require circuit design changes to eliminate or protect against such cross-talk. Moreover, each circuit is designed for a specific purpose. The bias current circuit is an analog circuit which has slow response time and low noise. The circuit which reduces the laser bias at low mirror velocities is also an analog circuit, with somewhat faster response time. The circuit which provides digital control of the laser diode is a very fast, digital circuit which need not have any analog capability.

BRIEF DESCRIPTION OF THE DRAWINGS

A better understanding of this invention, including its novel features and advantages, will be obtained upon consideration of the following detailed description and accompanying drawings wherein.

DETAILED DESCRIPTION

Figure 1:
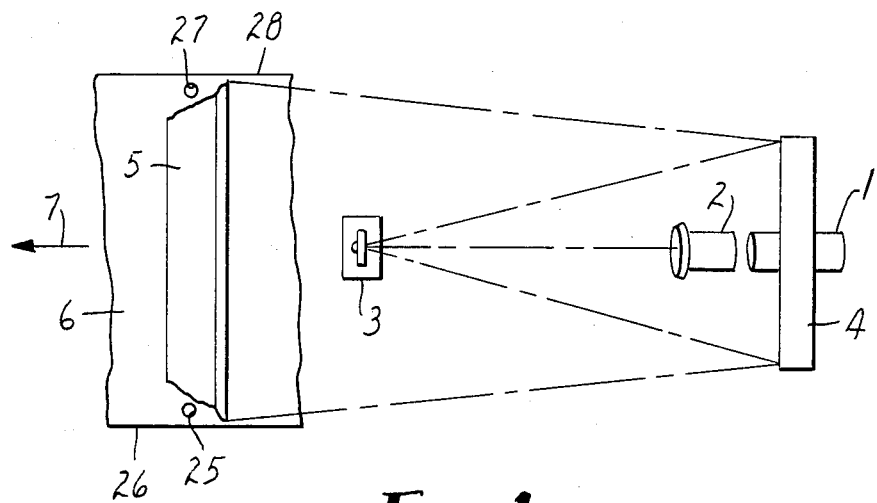
FIG. 1 is a plan view in schematic form illustrating the scanning portion of a laser printer apparatus.
Figure 2:
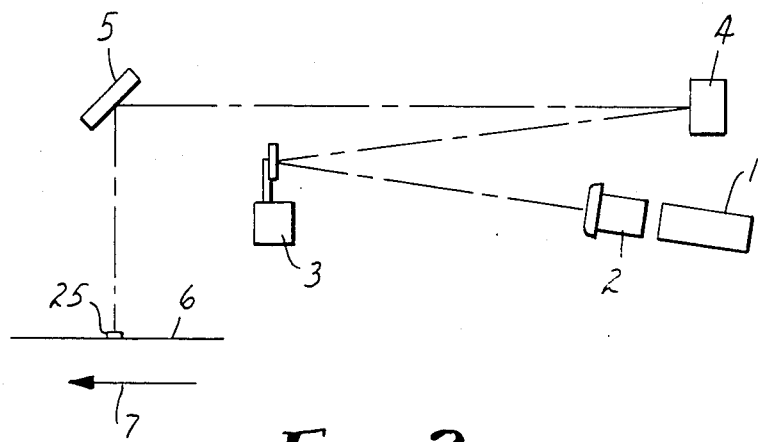
FIG. 2 is a side view of the scanning portion of a laser printer apparatus shown in FIG. 1.

Referring to FIG. 1 of the drawings, a plan view is shown illustrating the scanning portion of a laser printer which includes a laser diode 1, a lens system 2, a resonant scanning mirror 3, mirrors 4 and 5 and a photoconductor element 6. Such elements are also shown in FIG. 2, which is a side view of the apparatus of FIG. 1. The photoconductor element 6 is only partially and schematically shown. It is understood, however, that it can take the form of a belt, drum or flexible sheet.

Light from the laser 1 is focused by the lens system 2 onto the resonant scanning mirror 3 which oscillates to direct the light to mirror 4 causing the light to move as a scan lengthwise of mirror 4. The light presented to mirror 4 is reflected to mirror 5 which is positioned to direct such light to the photoconductor 6 to provide a line scan at the photoconductor 6. The photoconductor 6 is moved transversely of the light scan that is provided at the photoconductor 6 so a line-by-line scan is provided at the photoconductor 6. The direction of movement of the photoconductor 6 is indicated by the arrow 7.

The apparatus of FIGS. 1 and 2 requires the laser 1 to be controlled for on or off operation at the same point in one scan line as in the preceding scan line. Failure to precisely control this action will cause the image produced at the photoconductor to present an irregular appearance and portions of an image intended to present vertical regular appearance and portions of an image intended to present vertical lines will not be exactly vertical. The solution to this problem is solved in part by the use of the resonant scanning mirror 3 since its movement is highly reproducible from one line scan to the next due to its high "Q". The photoconductor 6 is provided with a uniform electrical charge prior to its presentment to light from the laser 1. The charge is removed at selected areas by on-off control of the laser 1 to define a latent image. Subsequent to the formation of the latent image, the photoconductor is moved past a development station (not shown) which causes toner particles at the development station to be deposited at the areas presenting a charge to develop the latent image. In the event the photoconductor is used to provide the final copy, the laser 1 is operated so that it is turned on when it is directed to an area where it is desired that no toner be deposited. The degree to which the charge on the photoconductor is removed in the areas where toner is not deposited is directly proportional to the amount of light energy that is received in such areas. Since the amount of light energy that is received at an incremental area is directly related to the time the laser output is directed to such area, it is necessary that the laser 1 receive a signal to influence the laser output so the laser output is proportional to the velocity of movement of the scanning mirror 3. The velocity of the scanning mirror 3 varies sinusoidally with the lowest velocity occurring at each edge of the photoconductor 6 and increasing sinusoidally to a maximum at the midpoint widthwise of the photoconductor 6.

Figure 3:
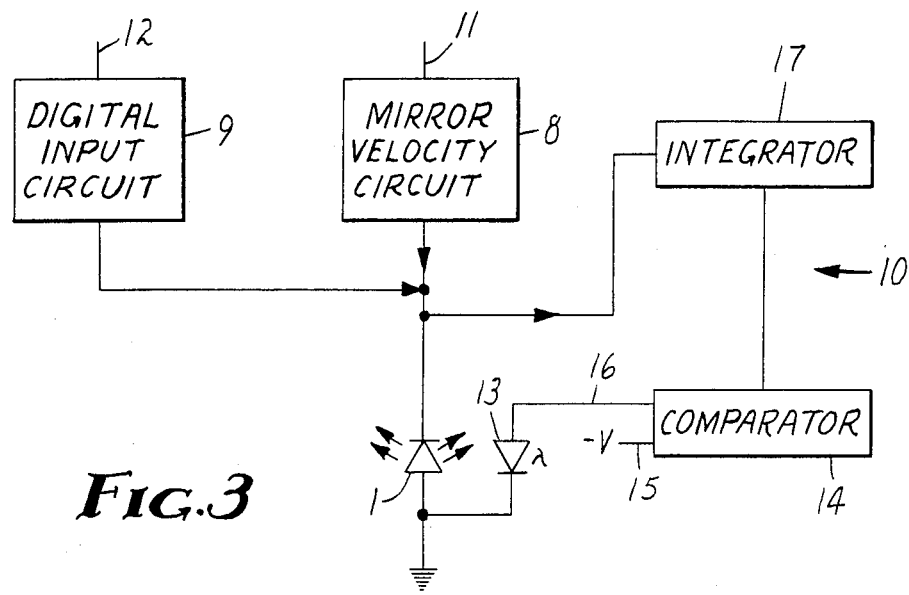
FIG. 3 is a schematic in block diagram form of a control circuit usable with the laser printer apparatus of FIGS. 1 and 2 for controlling the laser output level in such apparatus.

Referring to FIG. 3, a control circuit for laser diode 1 is shown in block diagram form that is usable with the scanning arrangement of FIGS. 1 and 2 to provide on-off control plus adjustment of the laser diode output level so it is directly proportional to the velocity of the scanning mirror 3 making the scanning arrangement of FIGS. 1 and 2 usable as a part of a laser printer apparatus.

The control circuit of FIG. 3 for laser diode 1 includes a mirror velocity circuit portion 8, a digital signal input portion 9 and a d.c. biasing current portion 10. The arrows on the conductors connecting the portions 8, 9 and 10 to the cathode laser diode 1 indicate the direction of current flow for such portions.

The mirror velocity circuit portion 8 receives a signal at input 11 that is proportional to the velocity of movement of the scanning mirror 3 of FIGS. 1 and 2. The signal at input 11 is based on a signal generated at a sensing coil (not shown) provided at the scanning mirror. The received velocity signal is amplified, inverted and its level shifted so as to present a signal above ground to the cathode of laser diode 1 which has its anode connected to ground to cause a change in the current flow through the laser diode so that the laser diode current is directly proportional to the velocity of the scanning mirror 3.

The digital signal input portion 9 receives digital signals (from a source not shown) at its input 12 which are used to provide signals at the output of portion 9 which is connected to the cathode of laser diode 1.

The d.c. biasing circuit portion 10 includes a photodiode 13 positioned to monitor the intensity of the light output from laser diode 1, a comparator 14 having a reference input 15, a second input 16 connected to the photodiode 13, and an integrator 17 connected to the output of the comparator 14 with integrator 17 output connected directly to the cathode of laser diode 1. The reference input 15 is connected to a voltage, which is provided at a level that serves to establish current flow through the laser diode 1 at a desired level that is above the threshold current level of the laser diode with no signal provided from either of the circuit portions 8 and 9. This unmodulated current level provided for such conditions is a level that produces a light intensity at the photoconductor 6 of FIGS. 1 and 2 that is sufficient to obtain the desired discharge of the photoconductor when the scanning mirror 3 is at the point of maximum velocity.

Figure 4:
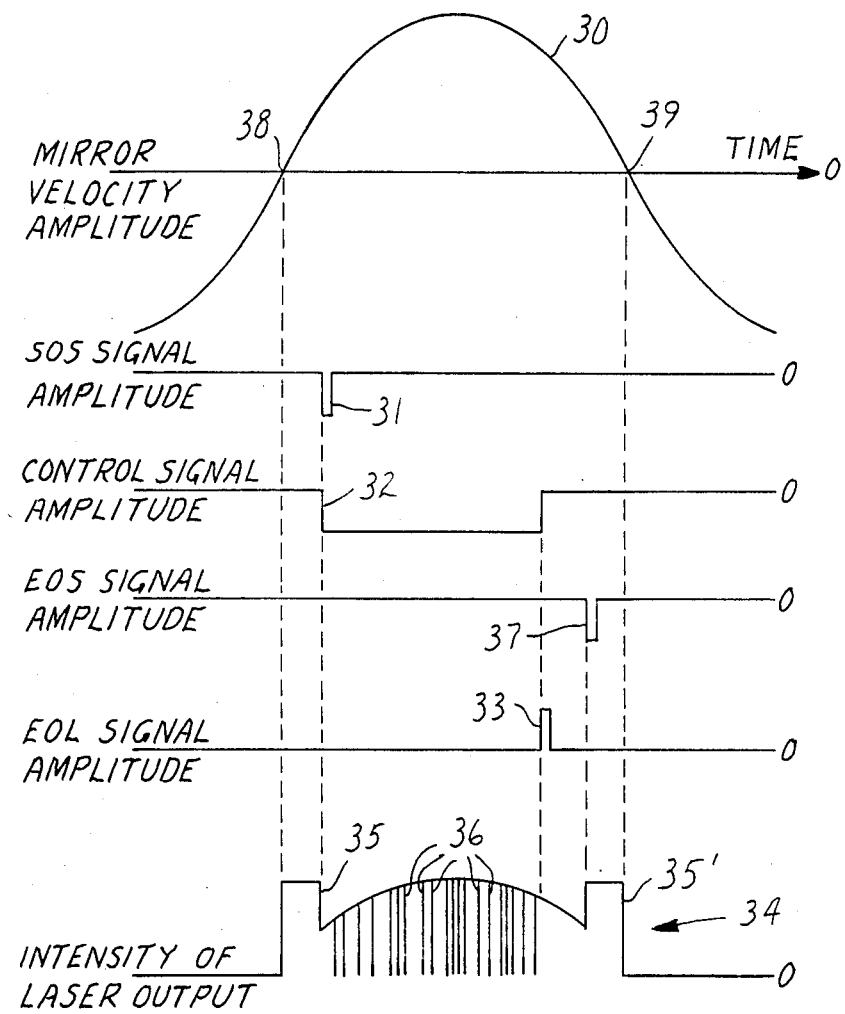
FIG. 4 shows various signals produced relative to time for use in explaining the invention.

Further understanding of how the control circuit of FIG. 3 can be used to control current for operation of the laser diode 1 in the apparatus of FIGS. 1 and 2 will be obtained by first considering the timed operation illustrated in FIG. 4 that is provided relative to movement of the scanning mirror 3. Referring to FIG. 4, the velocity of the scanning mirror 3 is represented by the sine wave 30 wherein the positive half of the sine wave represents a forward or "print" half of a cycle of movement of the scanning mirror, while the negative half of the sine wave represents the return or reverse half of a cycle of movement. For purposes of explaining the use of the control circuit of FIG. 3 for control of the operation of the laser diode 1, the reverse movement of the scanning mirror only serves to return the scanning mirror for making the next forward movement. It is only during a portion of each forward movement of the scanning mirror that the laser diode 1 is turned on and off according to digital signals applied to the input 12 of digital input circuit 9 to produce a latent image at the photoconductive element 7 of the laser printer. An electrical signal indicative of the sinusoidal wave form just described is obtained from the output of a sensing coil (not shown) that is normally available as a part of a scanning mirror structure. Transition of the scanning mirror movement from the completion of a return or reverse movement to a "print" or forward movement is readily detected since the signal from the sensing coil then changes polarity; for example, it changes from negative to positive as shown for sine wave 30. Similarly, the transition of movement of the scanning mirror from a forward to reverse direction is detected by the polarity change in the signal 30 from positive to negative. Since no printing action is to be carried out during the return or reverse half of each cycle of movement of the scanning mirror 3, the positive to negative polarity change is used to terminate operation of laser diode 1 with the negative to positive polarity transition which indicates the start of a forward movement used to allow the laser diode 1 to operate at an unmodulated current level above the threshold current level for the laser diode 1 until a start of scan (SOS) signal is produced when light from the laser diode 1 is detected by the light-to-electric transducer 25, FIG. 1. Such start of scan (SOS) signal occurs after the forward movement has begun and is indicated at 31 of FIG. 4. Referring to FIG. 1, the light-to-electric transducer 25 is positioned just above the photoconductor 6 about 1.3 centimeters inside the start of line scan edge 26 of the photoconductor 6 and in line with the scan line so as to receive light from laser 1 via mirror 5 when light from laser 1 is provided as the scanning mirror 3 begins a writing or scanning movement. The SOS signal is used to initiate a control signal 32, FIG. 4, that is utilized to allow digital signals to be provided to the digital input circuit 9 from digital data source, such as a memory (not shown). After a predetermined bits of data are obtained from the digital data source, as determined by the software program used in conjunction with the digital data source, an end of line (EOL) signal is provided which is shown at 33 in FIG. 4. The EOL signal occurs a short time before the forward movement of mirror 3 is completed and is used to terminate the control signal 32 that allows digital data signals to be made available for control of the laser diode 1.

In addition to initiating the control signal 32, the SOS signal 31 is used to time the start of modulation of the laser diode 1 current level in accordance with the velocity of the scanning mirror 3 as represented by the sine wave 30. The level of intensity of the laser diode 1 is shown at 34 in FIG. 4. Per the description given to this point, the laser diode 1 is off during the first portion of the reverse travel of mirror 3 as shown in FIG. 4 until the reverse to forward transition at 38 for mirror movement occurs. At such transition the level of intensity of laser diode 1, as indicated at 35, is established at a level determined by the current flow determined only by the biasing current circuit 10 which continues until an SOS signal 31 is produced. Beginning with the occurrence of the SOS signal 31, the output of laser diode 1 is then reduced inversely proportional to the velocity of the mirror 3 by the mirror velocity circuit 8 so the laser diode current varies directly at the velocity of mirror 3. In addition, the laser diode 1 is turned off in accordance with digital data signals received subsequent to the occurrence of the SOS signal 31. Such control of the laser diode current continues until the EOL signal 33 is provided. Off portions in the laser intensity curve due to digital data signals transmitted to the data input circuit 9 is represented by the vertical lines 36 in the sinusoidal portion of the laser intensity representation 34. By reducing the laser diode 1 current inversely proportional to the velocity of the scanning mirror 3 so the laser diode current varies directly with the mirror 3 velocity, the amount of light energy received at the photoconductive element 6 per unit area will be constant while the laser diode 1 is on between the occurrence of the SOS signal and the EOL signal. Though the time that digital data signals can be received is terminated when an EOL signal 33 is provided, the intensity of the laser diode 1 continues to be controlled in direct proportion to the velocity of the mirror 3 by the mirror velocity current 8 until light from the laser diode 1 is detected by the light-to-electric transducer 27, FIG. 1, of the printer, as shown in FIG. 1, the output of which is used to provide an end-of-scan (EOS) signal 37 as shown in FIG. 4. Referring to FIG. 1, the light-to-electric transducer 27 is positioned just above the photoconductor 6 and about 1.3 centimeters inside the end of line scan edge 28 of the photoconductor 6 and in line with the scan line so as to receive light from laser 1 via mirror 5 when light from laser 1 is provided as the scanning mirror nears the end of a writing or scanning movement. The EOS signal 37 serves to terminate operation of the mirror velocity circuit 8 and the digital input circuit 9 causing the laser diode 1 to again conduct at a desired level as determined only by the current flow provided by the biasing current circuit 10 to provide an intensity level as indicated at 35' that corresponds to the intensity level 35. Upon detection of the transition from forward to reverse movement of the mirror 3 as indicated at 39 in the mirror velocity curve 30 of FIG. 4, the laser diode 1 is turned off.

Figure 5:
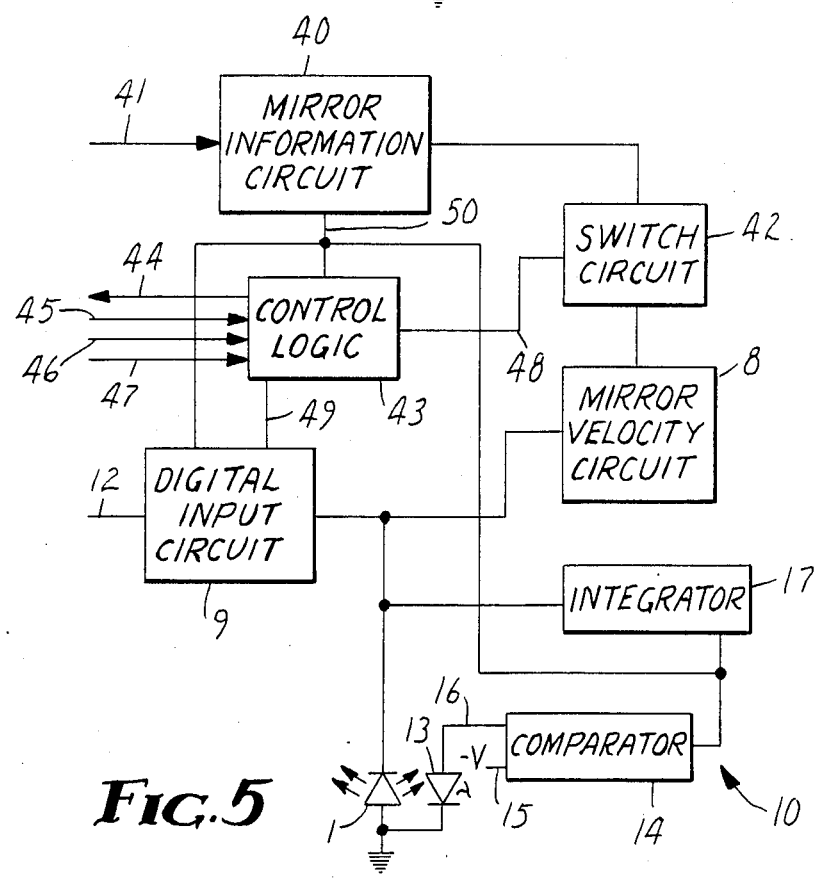
FIG. 5 is a schematic in block diagram form peripheral circuitry with the control circuit of FIG. 3.

FIG. 5 is an expansion of the control circuit of FIG. 3 wherein circuitry for providing signals to the control circuit of FIG. 3 is shown connected to the circuitry of FIG. 3. FIG. 5 will be described in connection with the timing signals and functions just described in connection with FIG. 4. The circuitry in FIG. 5 that is added to that of FIG. 3 includes a mirror information circuit 40, a switch circuit 42 and control logic 43. The sinusoidal signal 30 (FIG. 4) produced by the sensing coil (not shown) for the scanning mirror 3 when the mirror 3 is moving is transmitted to the input 41 of the mirror information circuit 40. The mirror information circuit 40 amplifies and filters the sinusoidal signal 30. The filtered signal is used to obtain forward/reverse information filtered signals. The signal is also transmitted to the mirror velocity circuit 8 via the switch circuit 42. The forward/reverse information signal produced by the mirror information circuit 40 is transmitted via the output line 50 to the digital input circuit 9, the bias current circuit 10 and also to control logic 43. The positive portion of the sine wave 30 is produced during movement of the mirror 3 in the forward direction and is used by the circuit 40 to produce a logic 1 signal on output 50. A logic 0 is produced by circuit 40 during the reverse movement of the mirror. The control signal 32, FIG. 4, is provided at the output of 49 of the control logic 43. The logic 0 portion of control signal 32 is produced in response to the receipt of the SOS signal at input line 47 of control logic 43. When the logic 0 of control signal 32 is transmitted from output 44, it causes digital signals to be transmitted from a source (not shown) to the input 12 of digital input circuit 9. The digital input circuit 9 also receives the control signal which is transmitted to it on line 49. Such control signal on line 49 plus the signal received from output 50, when there is forward movement of the mirror 3, causes the digital signals received at input 12 to be transmitted to the cathode of the laser diode 1 for on-off control of the laser diode. The control logic 43 receives the EOL and EOS signals 33 and 37 on input lines 45 and 46, respectively. The control logic 43 also has an output 48 at which a signal is produced when an SOS signal 31 is received at 47. Such signal continues until the logic 0 provided by EOS signal 37 is received at input 46. The transmission to switch circuit 42 of such signal at output 48 of the control logic 43 causes the switch circuit 42 to operate so the filtered mirror velocity signal transmitted from the mirror information circuit 40 to the switch circuit 42 is transmitted to the mirror velocity circuit 8. Such operation of the switch circuit 42 is terminated when the logic 0 provided by the EOS signal 37 is received at 46 by the control logic 43 to terminate passage of the filtered mirror velocity signal to the mirror velocity circuit. The logic 0 provided by control signal 32 at output 44 and the signal at output 49 to the digital input circuit 9 are removed when an EOL signal 33 is received at 45 by the control logic 43 causing termination of the transmission of data signals via the data input circuit 9.

Figure 6:
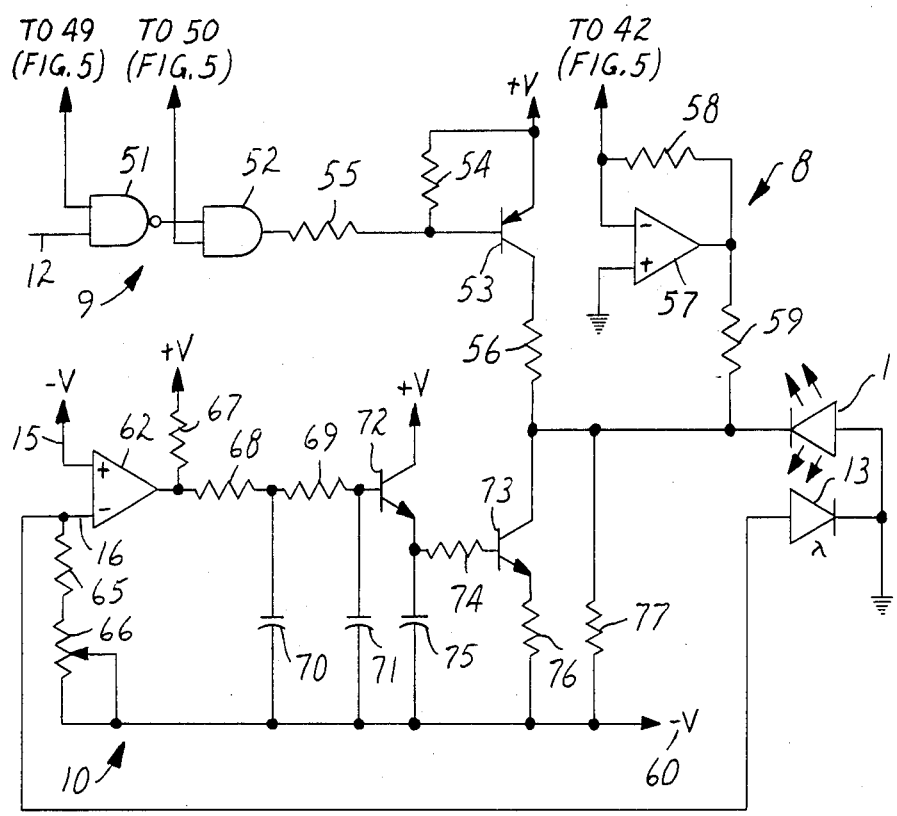
FIG. 6 is a showing of exemplary schematic circuits for the circuit portions of FIG. 3.

FIG. 6 is a schematic showing of exemplary circuits for the mirror velocity circuit 8, digital input circuit 9 and the biasing current circuit 10 of the invention. The circuits are shown interconnected.

The digital input circuit 9 includes a NAND gate 51, an AND gate 52 and a transistor 53 controlled by the output of the AND gate 52. The transistor 53 is a PNP transistor and has its emitter connected to a positive voltage. The emitter is also connected by a resistor 54 to the base of the transistor. The base of the transistor is coupled to the output of AND gate 52 via a resistor 55. The collector of the transistor is connected via a resistor 56 to the biasing current circuit 10 and directly to the cathode of the laser diode 1. The NAND gate has one input connected to the output 49 of the control logic 43 (FIG. 5) with a second input 12 provided for receiving binary input signals. The output of NAND gate 51 is connected to one input of AND gate 52 which has a second input connected to the output 50 of the mirror information circuit 40 (FIG. 5).

With the foregoing arrangement for the digital input circuit 9 and referring to FIGS. 4 and 5 of the drawings, the transistor 53 is turned on to oppose current flow through the laser diode 1 when it is desired that the laser diode 1 be turned off so as not to provide light to the photoconductive element 6 (FIG. 1). With light not provided to an area of the photoconductive element, the electrical charge provided to the photoconductive element 6 prior to its presentment to the output of laser diode 1 will remain in such area and toner will be attracted to such area when the photoconductive element is subsequently presented to a developer station (not shown). The output of AND gate 52 determines whether the transistor 53 is on or off. A logic 0 at the output of AND gate 52 will turn the transistor 53 on. Referring to FIG. 4, the laser diode 1 is off during the reverse movement of the mirror 3, which corresponds to the negative half of the sine wave 30. At this time the EOS signal and SOS signal inputs 46 and 47, respectively, to the control logic 43, FIG. 5, provide a logic 1, while the EOL signal input 45 provides a logic 0. The control signal output 44 (FIG. 5) is then providing a logic 1 so no data and, therefore, a logic 0 is provided to input 12 of NAND gate 51. The sine wave 30 is negative during the reverse movement causing the output 50 of the mirror information circuit 40 to provide a logic 0 to the AND gate 52. With the EOS and SOS signals providing a logic 1 and the output 50 from mirror information circuit 40 providing a logic 0, the control logic 43 is arranged so its output 49 then provides a logic 0 to NAND gate 51. With both inputs to NAND gate 51 low, its output, which is connected to one input of AND gate 52, will be a logic 1. With the logic 0 present at the other input to AND gate 52, the output of the AND gate 52 is then a logic 0 causing the transistor 53 to be turned on to place the laser diode 1 in an off condition.

Referring to FIG. 4, the next change to occur is the transition from a reverse to a forward movement of the mirror 3 which is evidenced by the sine wave going positive. Referring to NAND gate 51 and AND gate 52, only the input from output 50 of the mirror information circuit 40 is changed from a logic 0 to a logic 1 causing the output of AND gate 52 to present a logic 1 to prevent transistor 53 from conducting with the laser 1 then operating only in response to the current level determined by the biasing current circuit 10. The mirror velocity circuit 8 does not come into play to reduce the current of the laser 1 at this time since the switch circuit 42 remains open.

The next change in input to the control logic circuit 43 is the logic 0 presented by the SOS signal 31 presented at input 47 of the control logic 43. This causes the control signal 32 at output 44 of control logic 43 to provide a logic 0 allowing digital signals in the form of logic 1 or logic 0 signals to be presented to the input 12 of NAND gate 51 so that the transistor 53 is turned on to cause the laser 1 to be off when a logic 1 is provided by the digital input to NAND gate 51 and is turned off to cause the laser 1 to be on when the digital signal input is a logic 0. In addition to the control logic 43 presenting a logic 0 at output 44, the control logic 43 causes an output to be presented to the switch circuit 42 (FIG. 5) to cause it to provide the mirror velocity circuit 8 with the mirror velocity signal. The mirror velocity circuit 8 of FIG. 6 includes an amplifier 57 which is connected to invert and shift the level of the signal received from the mirror information circuit 40 via switch circuit 42 so as to reduce the current through the laser diode 1 inversely to the velocity of the mirror 3 so that more light is provided to the photoconductor element 6 when the velocity of the mirror 3 increases so that the amount of light received at the photoconductive element 6 will be the same for the entire scan, except when the laser diode 1 is turned off by the digital input circuit 9 in response to the binary signals presented to circuit 9 at input 12. Referring to the amplifier 57, the positive input is connected to ground while the negative input is connected to the switch circuit 42. The output and negative input are connected together via a resistor 58. The output is connected also to the cathode of the laser diode 1 via a resistor 59.

Referring to FIG. 4, the next change to take place in the operation of the circuit is the occurrence of the end of line (EOL) signal 33. This signal is one which is provided by circuitry supplying the digital signals and is effective to terminate the supply of digital signals for each forward movement of the mirror 3. The EOL signal 33 is supplied to the input 45 of control logic 43 causing the control signal 32 provided on output line 44 to change to terminate the supply of digital signals to the input 12 of the digital input circuit 9.

As indicated by FIG. 4, the end of scan (EOS) signal 37 is the next control signal event to occur. The EOS signal 37 is supplied to the control logic 43 via the input 46. The logic 0 provided by the EOS signal 37, along with the other existing inputs to the control logic 43, causes a logic 0 to be provided by the control logic 43 via output 49 to the NAND gate 51. With the other input 12 to NAND gate 51 also received a logic 0, the NAND gate 51 provides a logic 1 to one input of AND gate 52 which has a logic 1 provided to its other input via output 50 from the mirror information circuit 40 causing the output of AND gate 52 to be a logic 1. The logic 1 from AND gate 52 terminates conduction of the transistor 53. The control logic 43 is also arranged so the input conditions just described causes the control logic 43 to provide a signal an output 48 to switch circuit 42 to terminate the mirror information signal provided to the mirror velocity circuit 8 via the switch circuit 42. With transistor 53 off and the mirror velocity circuit 8 not receiving an input via the switch circuit 8, the laser 1 is operated at a current level 35', as shown in FIG. 4, determined solely by the biasing current circuit 10. This condition continues until the mirror information circuitry provides an indication of a reversal in the direction of movement of the mirror 3 as evidenced by the sine wave 30 going negative. This change is presented as a logic 0 at the output 50 of the mirror information circuit 40. This brings the condition of the various inputs to the control logic 43 and the digital input circuit to those existing when the first negative portion of the sine wave 30 of FIG. 4 was considered wherein the transistor 53 is turned on to reduce the current through laser 1 so that it is turned off.

The operation of the circuitry as described is then repeated when the next forward movement (positive half of the sine wave 30) of the mirror 3 occurs.

Referring to FIG. 6, an exemplary circuit for the biasing current circuit 10 of FIG. 5 is shown which includes a comparator circuit portion and an integrator circuit portion. The comparator circuit portion includes a comparator 62 having two inputs 15 and 16 and a biasing set point means provided by a resistor 65 connected in series with a potentiometer 66. The input 15 is connected to a negative reference voltage. The input 16 is connected to a negative voltage 60 via the resistor 65 and potentiometer 66. The input 16 is also connected to the anode of the photodiode 13 which has its cathode connected to the anode of laser diode 1. The photodiode 13, as mentioned in connection with FIG. 3, is positioned to respond to the light output of laser diode 1. With the photodiode positioned to respond to the output of the laser diode 1, the setting of potentiometer 66 relative to the voltage applied to the input 15 of the comparator establishes the desired maximum output level for the laser diode 1.

The output of the comparator 62 is connected to the integrator circuit portion which includes a resistor 67 for connecting a positive voltage to the input to the integrator circuit portion when the set point for the comparator to not satisfied. The resistor 67 is connected at one end to a positive voltage and has its other end connected to the output of the comparator 62. The comparator circuit selected for the comparator 62 is one that presents an open collector at its output so that the voltage on capacitor 70 of the integrator circuit portion is lowered quite rapidly when the set point is reached. The integrator circuit portion includes resistors 68 and 69 and capacitors 70 and 71 connected to provide an integrating function so that the biasing current rises over a time span of several hundred milliseconds before the output intensity of the laser diode reaches the level as determined by the set point. Resistor 68 is connected at one end to the output of comparator 62 and in series with resistor 69. Capacitor 70 is connected between the negative voltage 60 provided for the biasing circuit 10 and the connection common to resistors 68 and 69 while capacitor 71 is connected to the other end of resistor 69 and the negative voltage.

The integrator circuit portion also includes two transistors 72 and 73 wherein the base of transistor 72 is connected to the connection common to resistor 69 and capacitor 71 with the base of transistor 73 connected to the emitter of transistor 72 via a resistor 74. A capacitor 75 is connected between the emitter of transistor 72 and the negative voltage 60 for the biasing circuit 10. The transistor 73 has its collector connected to the collector of transistor 53 via resistor 56 and to the cathode of the laser diode 1. A resistor 76 is connected between the emitter of transistor 73 and the negative voltage 60 for biasing circuit 10. A resistor 77 is connected between the negative voltage 60 for the biasing circuit 10 and the collector of transistor 73. The biasing current for the laser diode 1 is determined by the current flow through transistor 73 and resistor 77. The current flow provided by transistor 73 is determined in turn by the conduction of transistor 72 which is controlled by the output of the comparator 62.

Referring to FIG. 6, it can be seen that the level of current flow through the laser diode 1 is determined by three circuits, the digital input circuit 9, the mirror velocity circuit 8 and the biasing current circuit 10. The three circuits provide current levels that are determined independent of each other. When operative, the digital input circuit 9 and the mirror velocity circuit 8 each present current flow that reduces the current through the laser diode 1. With each of the three circuits connected directly to the cathode of the laser diode 1, the three circuits act independently of each other with minimal cross-talk. Minimal cross-talk is desirable since it is directly related to the quality of control over the laser diode output and reduces the possibility of damage to the laser diode.

Although only a single embodiment of the present invention has been disclosed and described herein, it will be readily apparent to those skilled in the art that numerous changes and modifications may be made without departing from the spirit of the invention. Accordingly, the foregoing drawings and description thereof are for illustrative purposes only and do not in any way limit the invention which is defined only by the claims which follow.

What is claimed is:

1. A control circuitry for a laser diode adapted to direct its light output to a resonant scanning mirror having a velocity that varies sinusoidally, the circuit comprising:

means for providing a bias current for the laser diode that is in excess of a laser threshold current and is applied directly to the laser diode, and means resistively coupled to the laser diode providing a signal directly to the laser diode for changing the current through the laser diode, said signal varying inversely proportional to the velocity of the resonant scanning mirror;

means resistively coupled to the laser diode for receiving digital signals for providing a signal directly to the laser diode for one state of the digital signal which reduces the current through the laser diode below the laser threshold current; and means for inhibiting operation of the second-mentioned means and the last-mentioned means for a portion of the movement of the scanning mirror.

* * * * *

UNITED STATES PATENT AND TRADEMARK OFFICE
CERTIFICATE OF CORRECTION

PATENT NO. : 4,631,726

DATED : December 23, 1986

INVENTOR(S) : David J. Schoon

It is certified that error appears in the above-identified patent and that said Letters Patent is hereby corrected as shown below:

Column 6, line 27, "filtered signals. The" should read -- signals. The filtered --.

Column 8, line 63, "an" should read -- on --.

Signed and Sealed this

Twenty-eighth Day of April, 1987

Attest:

DONALD J. QUIGG

Attesting Officer

Commissioner of Patents and Trademarks